(12) United States Patent
Mokhlesi

(10) Patent No.: US 7,755,132 B2
(45) Date of Patent: Jul. 13, 2010

(54) NONVOLATILE MEMORIES WITH SHAPED FLOATING GATES

(75) Inventor: Nima Mokhlesi, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 772 days.

(21) Appl. No.: 11/465,025

(22) Filed: Aug. 16, 2006

(65) Prior Publication Data
US 2008/0042183 A1 Feb. 21, 2008

(51) Int. Cl.
*H01L 29/788* (2006.01)
*H01L 21/8247* (2006.01)

(52) U.S. Cl. .................. 257/315; 257/317; 257/E29.3; 257/E21.68; 438/201; 438/593

(58) Field of Classification Search ......... 257/314–326, 257/E21.645–E21.694, E29.17, E21.179–E21.182, 257/E21.209–E21.21, E21.433, E21.423, 257/E27.078, E29.3–E29.309, 239, 261; 438/201, 288, 573, 652, 211, 257, 593
See application file for complete search history.

(56) References Cited

U.S. PATENT DOCUMENTS

| | | | |
|---|---|---|---|
| 5,043,940 A | 8/1991 | Harari | 365/168 |
| 5,070,032 A | 12/1991 | Yuan et al. | 437/43 |
| 5,095,344 A | 3/1992 | Harari | 357/23.5 |
| 5,172,338 A | 12/1992 | Mehrotra et al. | 365/185 |
| 5,297,148 A | 3/1994 | Harari et al. | 371/10.2 |
| 5,313,421 A | 5/1994 | Guterman et al. | 365/185 |
| 5,315,541 A | 5/1994 | Harari et al. | 365/63 |
| 5,343,063 A | 8/1994 | Yuan et al. | 257/317 |
| 5,389,808 A | 2/1995 | Arai | 257/316 |
| 5,459,091 A | 10/1995 | Hwang | |
| 5,661,053 A | 8/1997 | Yuan | 437/43 |
| 5,712,180 A | 1/1998 | Guterman et al. | 437/43 |
| 6,040,220 A | 3/2000 | Gardner et al. | |
| 6,046,935 A | 4/2000 | Takeuchi et al. | 365/185.03 |
| 6,066,534 A | 5/2000 | Son | |
| 6,103,573 A | 8/2000 | Harari et al. | 438/257 |
| 6,151,248 A | 11/2000 | Harari et al. | 365/185.14 |
| 6,222,762 B1 | 4/2001 | Guterman et al. | 365/185.03 |
| 6,281,075 B1 | 8/2001 | Yuan et al. | 438/257 |
| 6,541,815 B1 | 4/2003 | Mandelman et al. | |
| 6,746,920 B1 | 6/2004 | Wen et al. | |
| 6,825,523 B2 | 11/2004 | Caprara et al. | 257/314 |
| 6,875,660 B2 * | 4/2005 | Hung et al. | 438/279 |
| 6,908,817 B2 | 6/2005 | Yuan | 438/264 |
| 6,984,863 B2 | 1/2006 | Miida | 257/368 |

(Continued)

OTHER PUBLICATIONS

International Search Report and Written Opinion dated Jun. 16, 2008 in PCT Application No. PCT/US2007/075041.

(Continued)

*Primary Examiner*—W. David Coleman
*Assistant Examiner*—Maliheh Malek
(74) *Attorney, Agent, or Firm*—Vierra Magen Marcus & DeNiro LLP

(57) ABSTRACT

In a nonvolatile memory using floating gates to store charge, individual floating gates are L-shaped. Orientations of L-shaped floating gates may alternate in the bit line direction and may also alternate in the word line direction. L-shaped floating gates are formed by etching conductive portions using etch masks of different patterns to obtain floating gates of different orientations.

13 Claims, 12 Drawing Sheets

U.S. PATENT DOCUMENTS

| | | | |
|---|---|---|---|
| 7,020,018 B2 | 3/2006 | Hsieh et al. | 365/185.03 |
| 7,026,684 B2* | 4/2006 | Sakuma et al. | 257/315 |
| 7,105,406 B2* | 9/2006 | Lutze et al. | 438/257 |
| 7,432,157 B2* | 10/2008 | Kim | 438/264 |
| 7,436,019 B2* | 10/2008 | Lutze et al. | 257/315 |
| 7,494,860 B2* | 2/2009 | Mokhlesi | 438/201 |
| 7,615,445 B2* | 11/2009 | Chien et al. | 438/257 |
| 2004/0084713 A1* | 5/2004 | Hsieh | 257/315 |
| 2004/0121540 A1 | 6/2004 | Lin | |
| 2004/0166641 A1* | 8/2004 | Hung et al. | 438/279 |
| 2004/0238852 A1 | 12/2004 | Lee et al. | |
| 2005/0087795 A1* | 4/2005 | Sakuma et al. | 257/315 |
| 2005/0104115 A1 | 5/2005 | Kianian | |
| 2005/0190605 A1* | 9/2005 | Miida | 365/185.24 |
| 2005/0199939 A1* | 9/2005 | Lutze et al. | 257/315 |
| 2006/0261399 A1* | 11/2006 | Widjaja et al. | 257/315 |
| 2006/0273378 A1* | 12/2006 | Gao et al. | 257/326 |
| 2007/0012979 A1* | 1/2007 | Song et al. | 257/296 |
| 2007/0020853 A1* | 1/2007 | Gao et al. | 438/266 |
| 2007/0047304 A1* | 3/2007 | Lee et al. | 365/185.05 |
| 2007/0053223 A1* | 3/2007 | Choi | 365/185.05 |
| 2007/0090445 A1* | 4/2007 | Lee et al. | 257/315 |
| 2007/0111422 A1* | 5/2007 | Lutze et al. | 438/201 |
| 2007/0158699 A1* | 7/2007 | Watanabe et al. | 257/264 |
| 2007/0190726 A1* | 8/2007 | Song et al. | 438/264 |
| 2008/0070364 A1* | 3/2008 | Zheng et al. | 438/268 |
| 2008/0074920 A1* | 3/2008 | Chien et al. | 365/185.01 |
| 2008/0246098 A1* | 10/2008 | Kurjanowicz | 257/408 |
| 2009/0004796 A1* | 1/2009 | Chang et al. | 438/264 |
| 2010/0047979 A1* | 2/2010 | Chien et al. | 438/257 |

OTHER PUBLICATIONS

Notice of Allowance dated Oct. 30, 2008 in U.S. Appl. No. 11/465,038.

* cited by examiner

NONVOLATILE MEMORIES WITH SHAPED FLOATING GATES

CROSS-REFERENCE TO RELATED APPLICATION

This application is related to U.S. patent application Ser. No. 11/465,038, filed Aug. 16, 2006, entitled, "METHODS OF FORMING NONVOLATILE MEMORIES WITH SHAPED FLOATING GATES"; which application is incorporated in its entirety by reference as if fully set forth herein.

BACKGROUND OF THE INVENTION

The present application relates to nonvolatile memories and methods of forming nonvolatile memories. In particular, this application relates to shaping of floating gates and different arrangements of shaped floating gates in nonvolatile memories.

There are many commercially successful non-volatile memory products being used today, particularly in the form of small form factor cards, which use an array of flash EEPROM (Electrically Erasable and Programmable Read Only Memory) cells. In one type of architecture, a NAND array, a series of strings of more than two memory cells, such as 16 or 32, are connected to one another such that the source of one is also the drain of the other in order to form columns of cells. Typically, each NAND string, consisting of, for example, 32 floating gate memory cells in series is terminated by two select transistors, one at each end of the string. The drain side select transistor's source diffusion is the same as drain of the last cell on the string. The drain of the drain side select transistor is connected to a global bit line. Global bit lines extend in a perpendicular orientation with respect to the word lines. Each NAND string resides under a particular bit line that provides access to it. A global bit line may span many thousands of NAND strings. The source side diffusion of the first floating gate transistor in the NAND string is the same as the drain of the source side select transistor. The source of the source side select transistor is typically connected to a shared line that runs parallel to the word lines. Word lines extend across cells spanning a large number of these columns. An individual cell within a column is read and verified during programming by causing the remaining cells in the string to be over driven so that the current flowing through a string is dependent upon the level of charge stored in the addressed cell. An example of a NAND architecture array and its operation as part of a memory system is found in U.S. Pat. No. 6,046,935.

In another type of array having a "split-channel" between source and drain diffusions, the floating gate of the cell is positioned over one portion of the channel and the word line (also referred to as a control gate) is positioned over the other channel portion as well as over the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315, 541, 5,343,063, 5,661,053, and 6,281,075.

A modification of this split-channel flash EEPROM cell adds a steering gate positioned between the floating gate and the word line. Each steering gate of an array extends over one column of floating gates, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). The use of steering gates in a flash EEPROM array is described, for example, in U.S. Pat. Nos. 5,313,421 and 6,222,762.

In any of the types of memory cell arrays described above, the floating gate of a cell is programmed by injecting electrons from the substrate to the floating gate. This is accomplished by having the proper doping in the channel region and applying the proper voltages to the source, drain and remaining gate(s).

Two techniques for removing charge from floating gates to erase memory cells are used in the three types of memory cell arrays described above. One is to erase to the substrate by applying appropriate voltages to the source, drain and other gate(s) that cause electrons to tunnel through a portion of a dielectric layer between the floating gate and the substrate. The other erase technique is to transfer electrons from the floating gate to another gate through a tunnel dielectric layer positioned between them. In the second type of cell described above, a third erase gate is provided for that purpose. In the third type of cell described above, which already has three gates because of the use of a steering gate, the floating gate is erased to the word line, without the necessity to add a fourth gate. Although this latter technique adds back a second function to be performed by the word line, these functions are performed at different times, thus avoiding the necessity of making a compromise because of the two functions. When either erase technique is utilized, a large number of memory cells are grouped together for simultaneous erasure, in a "flash." In one approach, the group includes enough memory cells to store the amount of user data stored in a disk sector, namely 512 bytes, plus some overhead data. In another approach, each group contains enough cells to hold several thousand bytes of user data, equal to many disk sectors' worth of data. Multi-block erasure, defect management and other flash EEPROM system features are described in U.S. Pat. No. 5,297,148.

As in most all integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172, 338.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner, since there is often at least one feature that is limited as to how much it can be shrunk, thus limiting the amount that the overall layout can be shrunk. When this happens, designers will turn to a new or different layout or architecture of the circuit being implemented in order to reduce the amount of silicon area required to perform its functions. The shrinking of the above-described flash EEPROM integrated circuit systems can reach similar limits.

Another flash EEPROM architecture utilizes a dual floating gate memory cell along with the storage of multiple states on each floating gate. In this type of cell, two floating gates are included over its channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised sufficiently high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. Examples of this cell array architecture and operating techniques are described in U.S. Pat. Nos. 5,712,180, 6,103,573 and 6,151,248.

In these and other types of non-volatile memories, the amount of field coupling between the floating gates and the control gates passing over them is carefully controlled. The amount of coupling determines the percentage of a voltage placed on the control gate that is coupled to its floating gates. The percentage coupling is determined by a number of factors including the amount of surface area of the floating gate that overlaps a surface of the control gate. It is often desired to maximize the percentage coupling between the floating and control gates by maximizing the amount of overlapping area. One approach to increasing coupling area is described by Yuan et al in U.S. Pat. No. 5,343,063. The approach described in that patent is to make the floating gates thicker than usual to provide large vertical surfaces that may be coupled with the control gates. Another approach that increases area coupling a floating gate and a control gate is described by Yuan in U.S. Pat. No. 6,908,817.

When increasing the vertical coupling areas between adjacent floating and control gates, it is further desirable to do so in a manner that does not increase the area of the substrate that is occupied by each cell. Also, it is preferable to reduce the floating gate to floating gate coupling, so that adjacent floating gates do not greatly affect each other.

SUMMARY OF THE INVENTION

A floating gate that is L-shaped in cross section along the word line direction presents an L-shaped facet to an adjacent floating gate in the bit line direction. In other words, two neighboring floating gates that reside on two neighboring word lines will present L-shaped facets to one another. The L-shaped facet may have less area than a conventional rectangular floating gate, while maintaining the same (or better) coupling between the floating gate and the overlying word line. In addition, the parasitic coupling between two neighboring floating gates that reside on two neighboring word lines may be reduced further than the facet area reduction alone would indicate. This further reduction is provided by the fact that an L-shaped floating gate may substantially reduce the distance of the furthest points on the L-shaped facets from their own control gate, allowing these distances to become smaller than the floating gate to floating gate distance, and thereby reducing the floating gate to floating gate capacitance beyond the reduction provided by facet area reduction. More field lines emanating from the L-shape facet can now turn and terminate on their own control gate rather than extending across and terminating on the adjacent floating gate that resides below a neighboring word line. All the floating gates along a NAND string of floating gate memory cells may have the same orientation in one embodiment. In another embodiment, floating gates along a string are L-shaped with alternating orientations. Floating gates alternate between having an L-orientation and a reverse-L-orientation. One advantage of such alternating orientations is that opposing facets of adjacent floating gates in the bit line direction have reduced capacitive coupling. In another embodiment, orientations of L-shaped floating gates alternate along the word line direction. This may be in addition to alternating along the bit line direction. In addition to L-shaped floating gates, other asymmetrical shapes of floating gates may be formed and arranged to have alternating orientations.

In a process for forming a memory array with L-shaped floating gates, a gate dielectric layer is formed over a surface of a substrate and a first conductive layer is formed over the gate dielectric layer. A masking layer is formed over the first conductive layer and a resist layer is formed over the masking layer. The resist layer is patterned and the pattern transferred to the masking layer, forming masking portions. These masking portions are then used to form STI structures extending in the y-direction. STI structures divide the first conductive layer into first conductive portions. Masking portions are then replaced by second conductive portions. The first and second conductive portions are in contact and form electrically continuous conductive portions that extend in the y-direction. These conductive portions may be formed into L-shaped floating gates by partially etching them using a patterned etch mask. Different etch masks may be used depending on the desired orientations of L-shaped floating gates. Partial etching causes areas of conductive portions to be partially etched in a vertical direction. Etched areas extend along a sidewall of an STI structure, leaving a narrowed conductive portion that extends along a sidewall of an adjacent STI structure. Subsequently, the etch mask is removed and STI structures are etched back. Then a dielectric layer or a combination of dielectric layers is deposited and a conductive layer is deposited over the dielectric layer(s). Separate word lines are formed from the conductive layer and conductive portions are separated into separate floating gates in the same etch step so that these features are self-aligned.

DETAILED DESCRIPTION OF ILLUSTRATED EMBODIMENTS

Memory Structure

Figure 1:
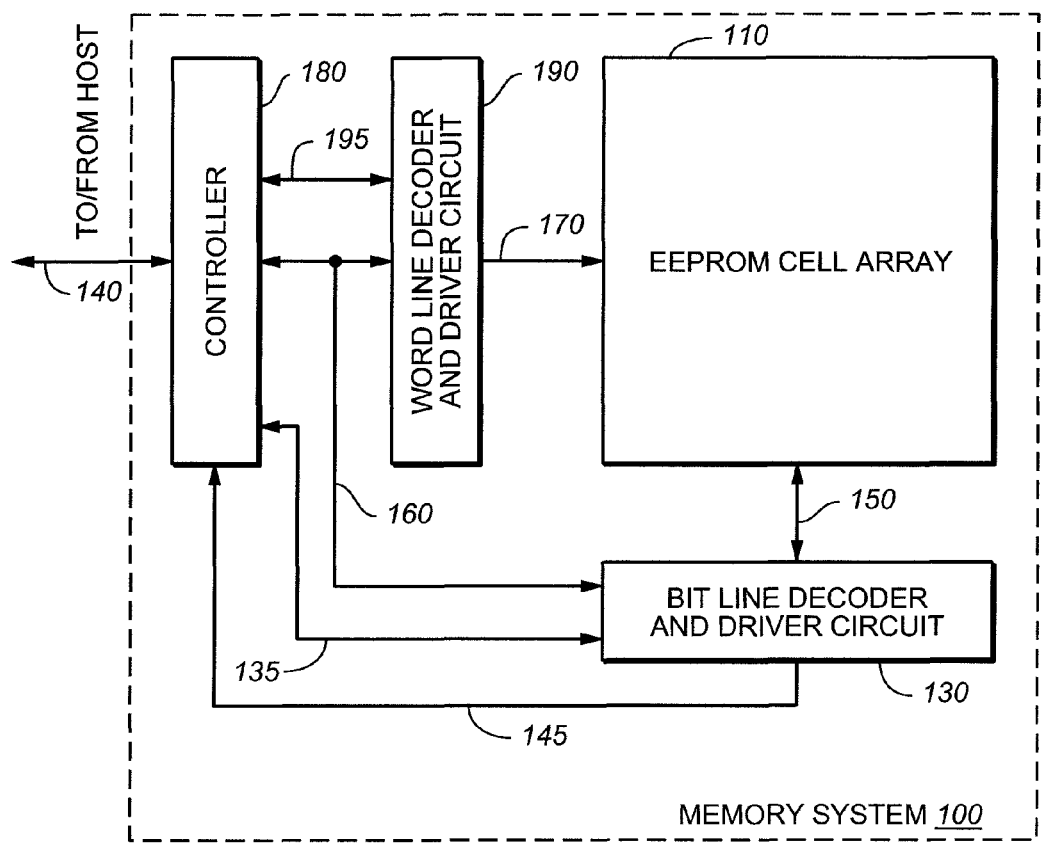
FIG. 1 shows a memory system that includes a memory array according to embodiments of the present invention.

An example of a memory system 100 incorporating various aspects of the present invention is generally illustrated in the block diagram of FIG. 1. A large number of individually addressable memory cells are arranged in a regular array 110 of rows and columns, although other physical arrangements of cells are certainly possible. Bit lines, designated herein to extend along columns of the array 110 of cells, are electrically connected with a bit line decoder and driver circuit 130 through lines 150. Word lines, which are designated in this description to extend along rows of the array 110 of cells, are electrically connected through lines 170 to a word line decoder and driver circuit 190. Each of the decoders 130 and 190 receives memory cell addresses over a bus 160 from a memory controller 180. The decoder and driving circuits are also connected to the controller 180 over respective control and status signal lines 135 and 195.

The controller 180 is connectable through lines 140 to a host device (not shown). The host may be a personal computer, notebook computer, digital camera, audio player, various other hand held electronic devices, and the like. The memory system 100 of FIG. 1 will commonly be implemented as a removable memory, such as a card, according to one of several existing physical and electrical standards, such as one from the PCMCIA, the CompactFlash™ Association, the MMC™ Association, and others. When in a card format, the lines 140 terminate in a connector on the card that interfaces with a complementary connector of the host device. The electrical interface of many cards follows the ATA standard, wherein the memory system appears to the host as if it was a magnetic disk drive. Other memory card interface standards also exist. As an alternative to the card format, a memory system of the type shown in FIG. 1 may be permanently embedded in the host device.

The decoder and driver circuits 130 and 190 generate appropriate voltages in their respective lines of the array 110, as addressed over the bus 160, according to control signals in respective control and status lines 135 and 195, to execute programming, reading and erasing functions. Any status signals, including voltage levels and other array parameters, are provided by the array 110 to the controller 180 over the same control and status lines 135 and 195. A plurality of sense amplifiers within the circuit 130 receive current or voltage levels that are indicative of the states of addressed memory cells within the array 110, and provides the controller 180 with information about those states over lines 145 during a read operation. A large number of sense amplifiers are usually used in order to be able to read the states of a large number of memory cells in parallel. During reading and program operations, one row of cells is typically addressed at a time through the circuits 190 for accessing a number of cells in the addressed row that are selected by the circuit 130. During an erase operation, all cells in each of many rows are typically addressed together as a block for simultaneous erasure.

Figure 2:
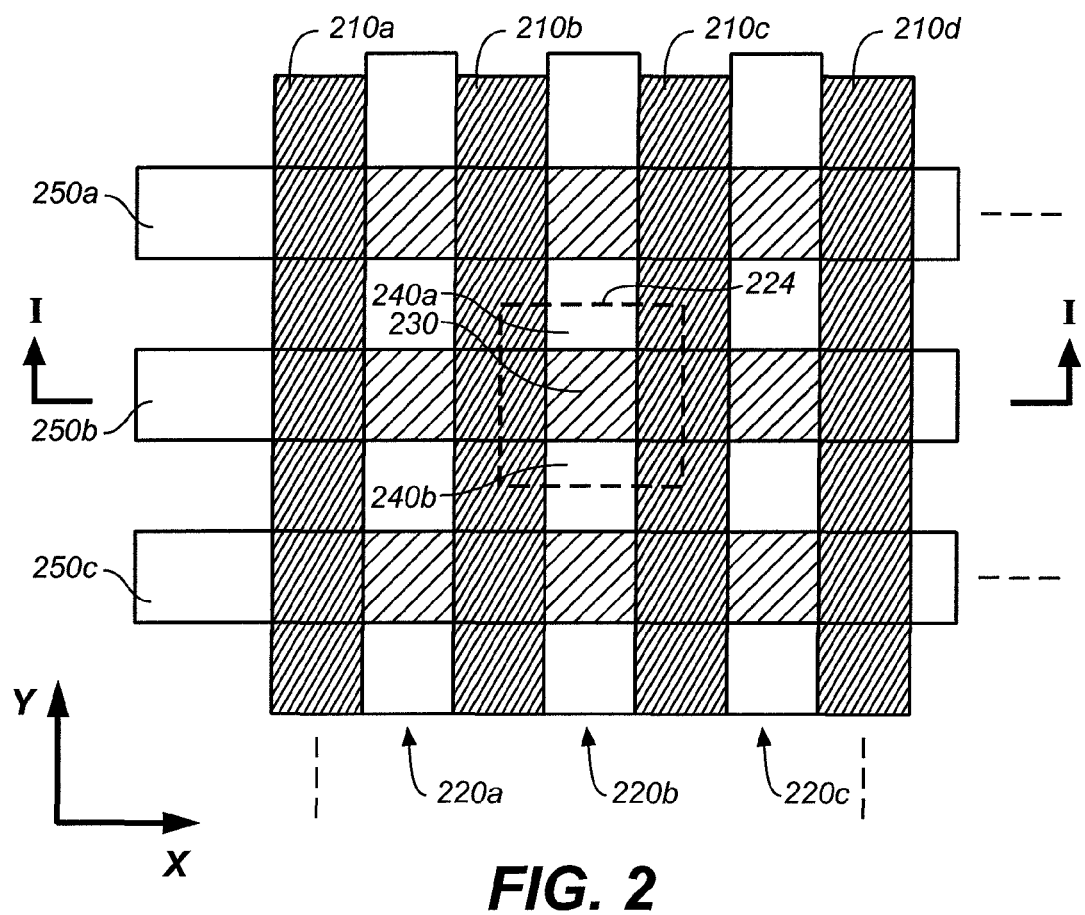
FIG. 2 shows a detailed view of the memory array of FIG. 1 including NAND strings of floating gate memory cells.

A plan view of an example of a NAND memory cell array 110 formed on a silicon substrate is shown in FIG. 2, wherein a small part of its repetitive structure of conductive elements is illustrated with little detail of dielectric layers that exist between the elements, for clarity of explanation. Shallow Trench Isolation (STI) structures 210a-d are formed extending through the surface of the substrate. In order to provide a convention for this description, the STI structures are shown to be spaced apart in a first direction (x-direction), with lengths extending in a second direction (y-direction), these first and second directions being essentially orthogonal with each other.

Between the STI structures 210a-d, there are strings 220a-c of memory cells running in the y-direction. Thus, the direction of the strings is parallel to the direction of the STI structures. Each string 220a-c includes many memory devices connected in series. FIG. 2 shows portions of three such strings 220a-c with three memory cells shown for each string. However, strings 220a-c contain additional cells that are not shown in FIG. 2. Also, the array 110 contains additional strings that are not represented in FIG. 2. This type of array may have thousands of strings with 16, 32 or more cells in each string.

An exemplary memory cell 224 includes a floating gate 230 and conductive source/drain regions 240a-b in the substrate adjacent to floating gate 230, on either side in the y-direction. STI structures 210b, 210c form isolating elements that electrically isolate source/drain regions 240a, 240b from source/drain and channel regions of cells in adjacent strings 220a, 220c. Along the y-direction source/drain regions 240a, 240b are shared by adjacent cells. Source/drain regions, including source/drain regions 240a, 240b, electrically connect one cell to the next cell thus forming a string 220b. The source/drain regions 240a, 240b in this example are formed by implanting impurities into the substrate in the required areas.

Figure 3A:
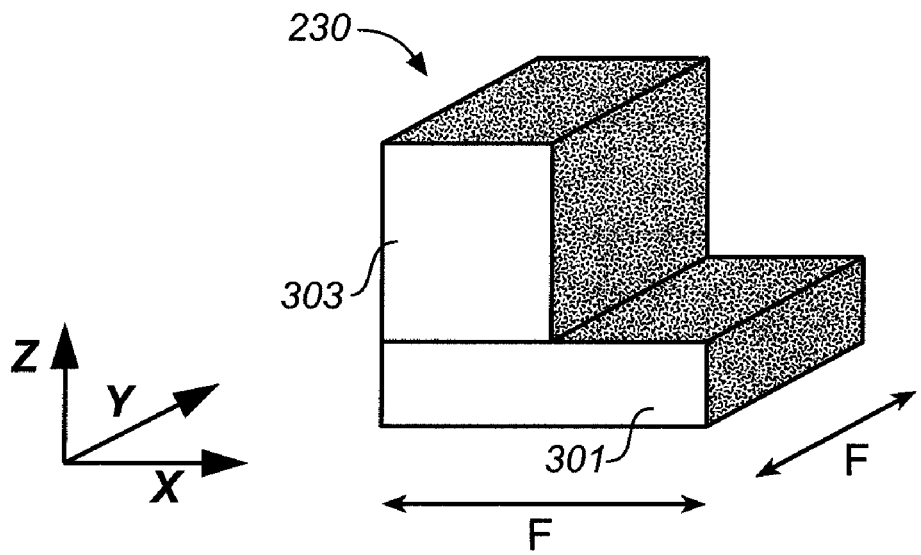
FIG. 3A shows a detailed view of a floating gate of a memory cell of FIG. 2, the floating gate being L-shaped in cross section.

FIG. 3A shows an individual floating gate 230 of memory cell array 110 so that its three dimensional shape can be clearly seen. The z-axis of FIG. 3A extends perpendicularly from the substrate surface and is thus perpendicular to the view of FIG. 2. It can be seen that floating gate 230 is L-shaped in cross section along the x-direction. Floating gate 230 is formed having a base 301 that has a square footprint, with the dimension of a side of the square being equal to the minimum feature size (F) of the lithographic process used. In other examples, these dimensions may be different. Extending from base 301 is a projection 303 that extends from one side of base 301 to give floating gate 230 an L-shape. As a result of being L-shaped, floating gate 230 presents L-shaped facets to adjacent floating gates in the bit line direction.

Figure 3B:
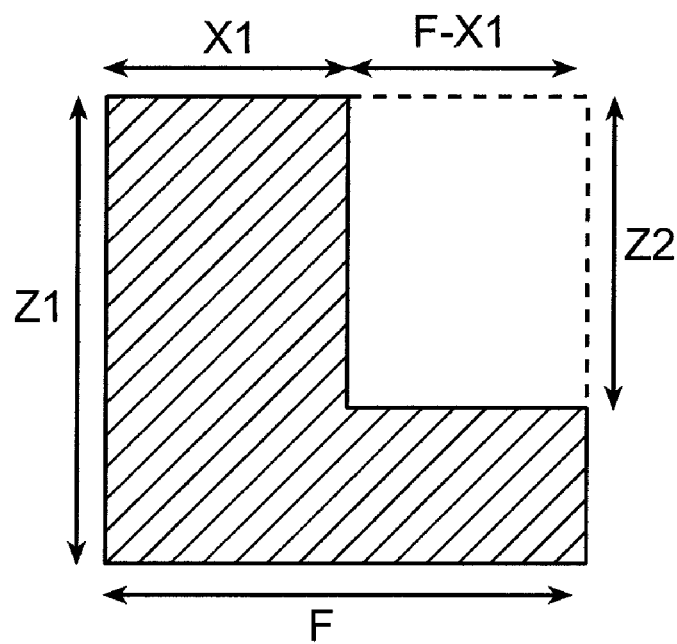
FIG. 3B shows a facet of the floating gate of FIG. 3A including comparison with a rectangular shaped floating gate.

FIG. 3B shows the dimensions of a facet of floating gate 230 of FIG. 3A. FIG. 3B also shows the shape of a facet of a rectangular floating gate in outline. It can be seen that the area of the L-shaped facet is less than the area of a rectangular facet having the same height (Z1) and width (F). However, there is no reduction in the perimeter of the facet, so that coupling between floating gate 230 and an overlying control gate is approximately the same as for a rectangular floating gate (coupling area is the perimeter of the floating gate where the control gate overlies it multiplied by the y-dimension). In the example of FIG. 3B, the dimension F–X1 is approximately equal to X1 so that projection 303 is approximately half the width of base portion 301. However, this is not always so. The coupling between a floating gate and a control gate does not depend on having a particular value of X1 so that some variation in this value is acceptable.

Process Flow

Figure 4:
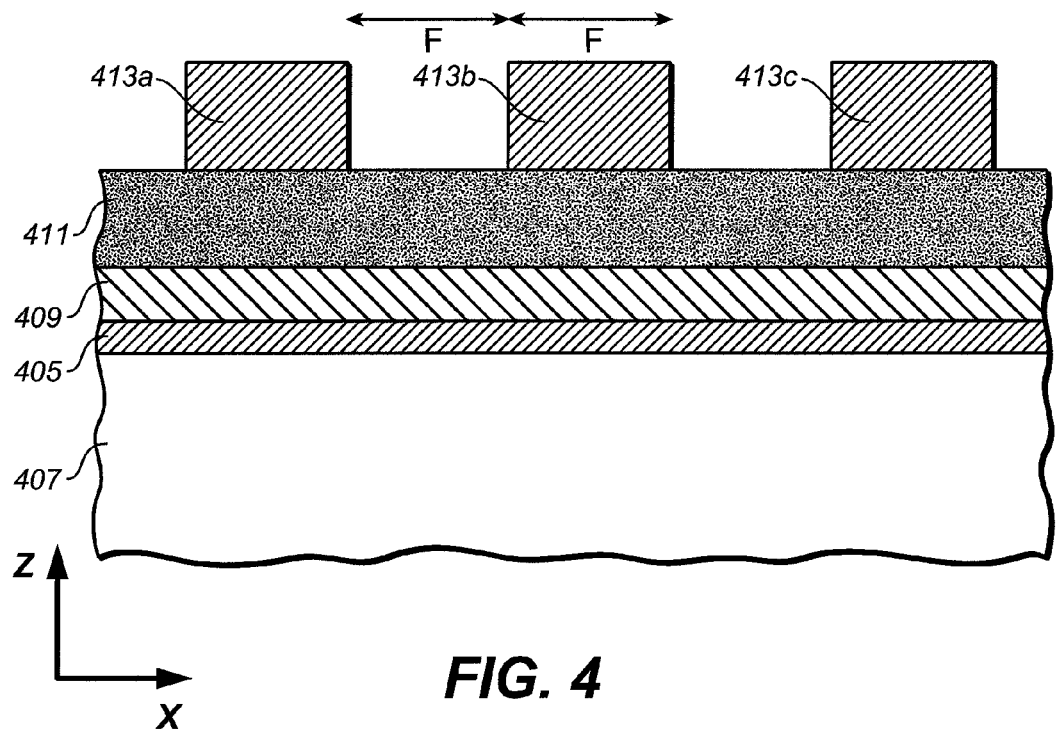
FIG. 4 shows a cross sectional view of the memory array of FIG. 2 at an earlier stage of fabrication, including a gate dielectric layer, first conductive layer and masking layer with a patterned resist layer overlying the masking layer.

FIG. 4 shows a cross sectional view of the nonvolatile memory array of FIG. 2, along the x-direction, at an earlier stage of fabrication. The cross section of FIG. 4 is indicated by I-I in FIG. 2. FIG. 4 shows a gate dielectric layer 405 extending over substrate 407 and a first conductive layer 409 extending over gate dielectric layer 405. Typically, gate dielectric layer 405 is formed of Silicon Dioxide that is grown by oxidation of the Silicon surface of substrate 407. Subsequently, first conductive layer 409 may be formed of polysilicon by Chemical Vapor Deposition (CVD) or otherwise. A masking layer 411 of dielectric (Silicon Nitride in this example) extends over first conductive layer 409. In another embodiment the masking layer can be composed of one or more conductive materials such as doped polysilicon. Gate dielectric 405, first conductive layer 409 and masking layer 411 may all be formed as blanket layers that extend over the entire substrate 407. Resist portions 413a-c overlie masking layer 411. Resist portions 413a-c are formed according to a pattern that is lithographically established. In this case, resist portions 413a-c have a dimension in the x-direction that is equal to the minimum feature size (F) of the lithographic process used to form them. Resist portions 413a-c are also spaced apart in the x-direction a distance equal to F. In other examples, resist portions may have an x-dimension that is greater than F, or using resist slimming or other techniques, may have an x-dimension that is less than F. Resist portions 413a-c extend in the y-direction (perpendicular to the view of FIG. 4). The pattern established by resist portions 413a-c is used to pattern masking layer 411 into masking portions, which in turn are used as an etch mask to form STI structures.

Figure 5:
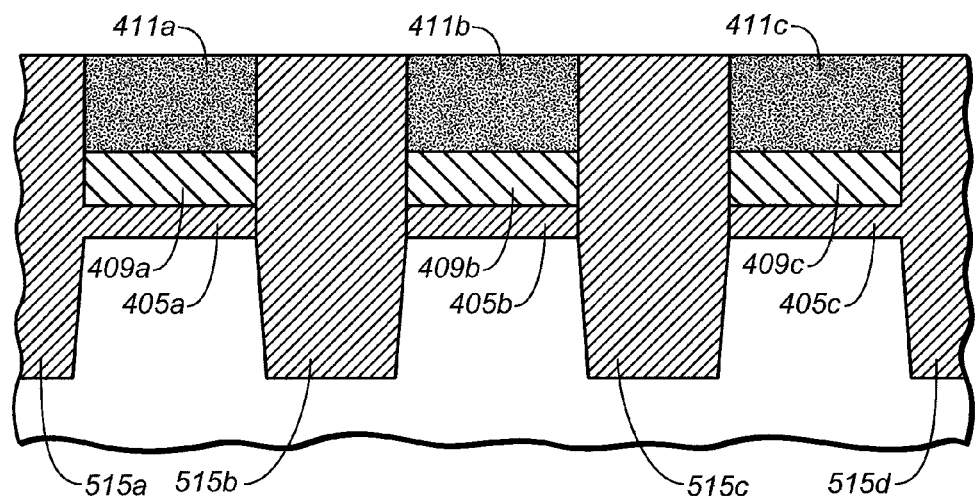
FIG. 5 shows the structure of FIG. 4, in the same view, after transferring the pattern of the resist layer to the masking layer and then using the masking layer to establish locations of STI structures.

FIG. 5 shows the structure of FIG. 4, in the same view, after formation of the masking portions 411a-c from masking layer 411 and formation of STI structures 515a-d. Masking portions 411a-c are formed by etching masking layer 411 with resist portions 413a-c in place so that the pattern of resist portions 413a-c is transferred to masking layer 411. Then, masking portions 411a-c are used as a mask for subsequent etching of the first conductive layer 409, gate dielectric layer 405 and underlying substrate 407 to form STI trenches. In etching through the first conductive layer 409, first conductive layer 409 is divided up into first conductive portions 409a-c that extend as strips in the y-direction. Gate dielectric layer 405 is similarly divided into dielectric portions 405a-c. Because first conductive portions 409a-c are formed by the same step that forms STI trenches, these features are self-aligned. STI trenches are filled with dielectric or dielectrics (deposited Silicon Dioxide in this example) to form STI structures 515a-d. At least one dielectric material may be deposited so that it fills STI trenches and covers masking portions 411a-c and may then be planarized, for example, by utilizing chemical/mechanical polishing so that any dielectric material overlying masking portions 411a-c is removed.

Subsequently, masking portions 411a-c are removed and second conductive portions 617a-c are formed in their place. Second conductive portions 617a-c may be formed of polysilicon. Polysilicon may be deposited as a blanket layer and then planarized so that any polysilicon overlying STI structures 515a-d is removed. A first conductive portion 409a and a second conductive portion 617a may be considered to form a single conductive portion 618a. Conductive portions 618b and 618c are similarly formed from first and second portions. In a first embodiment, shown in FIG. 6A, the entire volume previously occupied by a masking portion is filled with polysilicon. Alternatively, if masking portions 411a-c are conductive, this replacement step is unnecessary as masking portions 411a-c form second conductive portions.

Figure 6A:
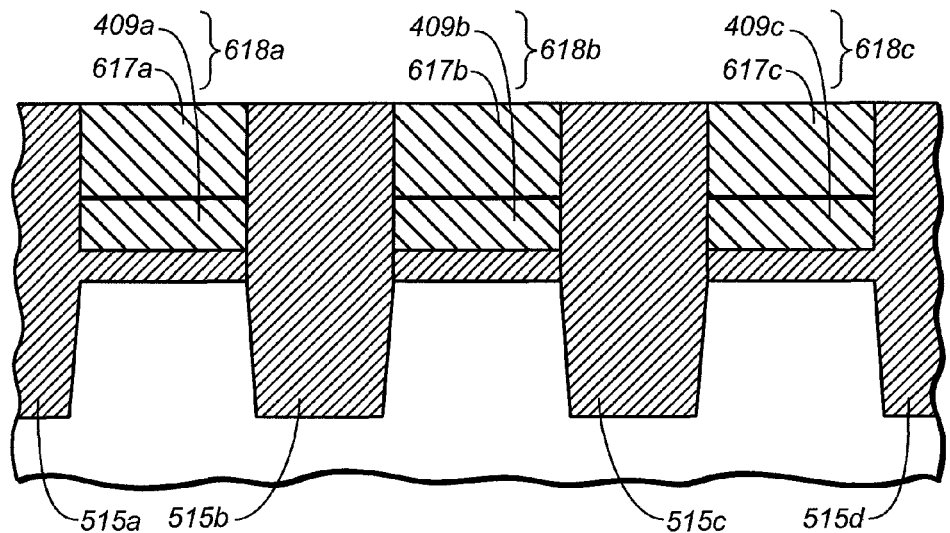
FIG. 6A shows the structure of FIG. 5 after replacing masking layer portions with a second conductive layer and planarizing.
Figure 6B:
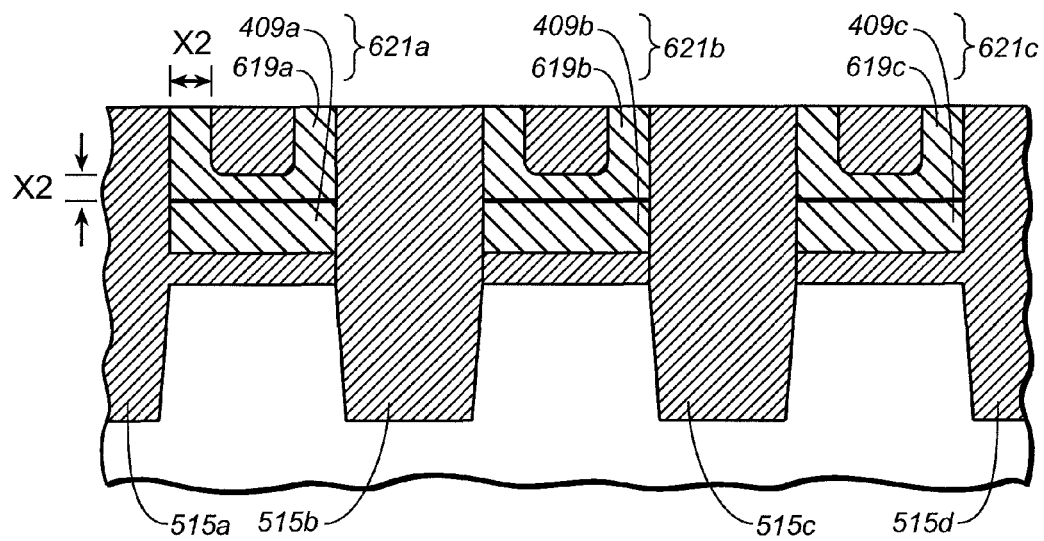
FIG. 6B shows an alternative structure to that of FIG. 6A where masking layer portions are replaced using a thin second conductive layer followed by a dielectric layer and then planarization.

In an alternative embodiment, shown in FIG. 6B, a polysilicon layer is deposited that does not fill the entire volume previously occupied by a masking portion. An additional dielectric layer is added over the polysilicon layer and then planarization is performed. In this way, the thickness X2 of second conductive portions 619a-c may be made smaller and thickness X2 may be carefully controlled. Second conductive portions 619a-c directly overlie first conductive portions 409a-c and are in electrical contact with first conductive portions 409a-c. Therefore, a second conductive portion 619a and the first conductive portion 409a over which it lies may be considered as a single conductive portion 621a. Conductive portions 621b and 621c are similarly formed of first and second portions. In either embodiment, after planarization, masking portions are formed over the planarized surface of second conductive portions and STI structures.

Figure 7A:
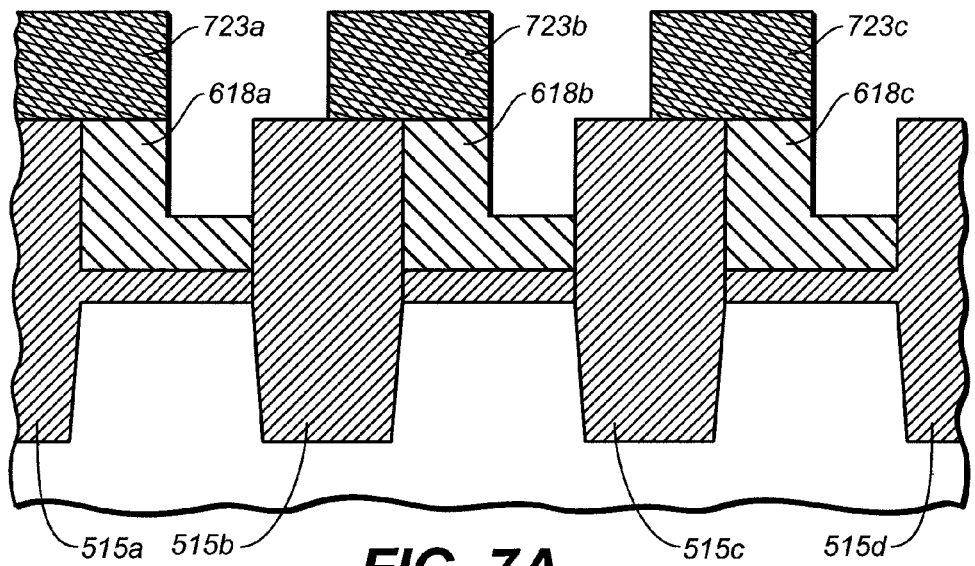
FIG. 7A shows the structure of FIG. 6A after formation of a resist pattern overlying conductive portions and STI structures and using the resist pattern to partially etch conductive portions.

FIG. 7A shows the structure of FIG. 6A with masking portions 723a-c extending over STI structures 515a-d and over conductive portions 618a-c. A masking layer may be formed of resist that is deposited as a blanket layer and subsequently patterned to form masking portions 723a-c. In a first embodiment, the resist layer is simply patterned into a series of elongated portions that extend in the y-direction and that have a width of F (other patterns will be discussed later). Masking portions 723a-c are located so that an individual resist portion 723a partially overlies an STI structure 515a and partially overlies a conductive portion 618a. This may require alignment of the pattern used to form resist portions 723a-c and the pattern of STI structures 515a-d and conductive portions 618a-c. Resist portions 723a-c are used as an etch mask to etch conductive portions 618a-c as shown. Anisotropic etching is used to etch in a vertical direction and the etch chemistry is selective to polysilicon so that STI structures 515a-d are not substantially etched. Etching may stop at the interface between first conductive portions 409a-c and second conductive portions 617a-c or at some other level. Etching may extend into first conductive portions 409a-c, or may stop at some level above first conductive portions 409a-c. An additional wet etch may be performed after the anisotropic etch. The optional wet etch may serve to further narrow the vertical and the horizontal dimensions of the L-shaped conductive portions 618a-c. Subsequently, an optional step consisting of a partial or a complete fill may be performed to fill volumes created by etching with dielectric material. The filling material can then be planarized to remove excess filling material that extends above the conductive portions. Alternatively, the dielectric filling and subsequent planarization may not be necessary. Then an etchback of dielectric material including STI structures 515a-d is performed. This etchback is selective to dielectric over polysilicon and may be an anisotropic dry etch. In some cases this selectivity makes the filling with dielectric filling material and subsequent planarization unnecessary.

Figure 7B:
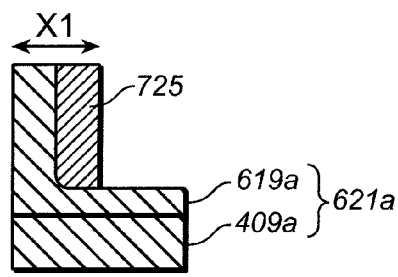
FIG. 7B shows an individual conductive portion of the alternative embodiment of FIG. 6B after partially etching with an etch mask partially overlying the conductive portion.

FIG. 7B shows a conductive portion 621a according to the alternative embodiment of FIG. 6B after etching using resist portions as described above. As is shown, some dielectric material 725 remains after etching. The width of the second conductive portion 619a and remaining dielectric material 725 is X1. The value of X1 is determined by the location and extend of a resist portion of the etch mask used to shape the conductive portion and thus depends on alignment of the pattern used to form the resist portion.

Figure 8B:
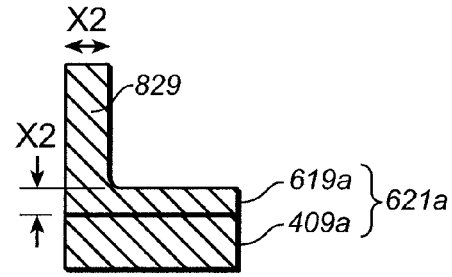
FIG. 8B shows the individual conductive portion of FIG. 7B after removal of dielectric, leaving a narrow upper portion.
Figure 8A:
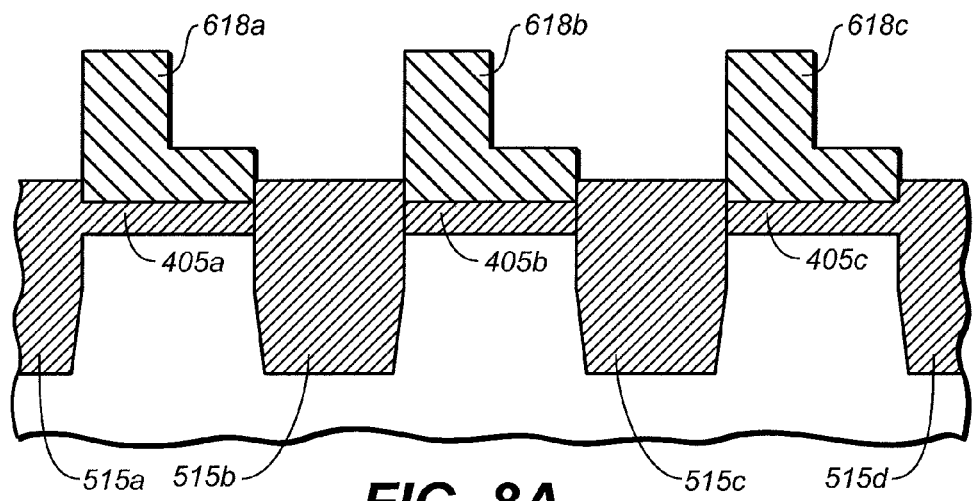
FIG. 8A shows the structure of FIG. 7A after removal of resist portions and etching back of STI structures to a level close to the substrate surface.

FIG. 8A shows the structure of FIG. 7A after an etchback process. The etchback process removes STI structures 515a-d down to a level that is higher than the top of the gate dielectric layer portions 405a-c in this example, though the structure may be etched back to other levels also. The etchback process leaves sides of conductive portions 618a-c exposed. Conductive portions 618a-c extend in the y-direction at this point, with an L-shape in cross section along the x-direction as shown. Subsequently, a dielectric layer or layers and a control gate layer or layers are formed over the structure of FIG. 8A.

Where conductive portions are formed as shown in FIG. 7B, any remaining dielectric material 725 that was deposited over conductive portion 621a may be removed by the etchback step as shown in FIG. 8B. This leaves an L-shaped conductive portion 621a with a vertical projection 829 having a thickness X2 in the x-direction that is equal to the thickness of the deposited second conductive portion 619a. This is less than the thickness X1 determined by patterning with an etch mask. In contrast to the example of FIG. 8A, this thickness, X2, is not determined by alignment and may be more tightly controlled than a dimension determined by alignment.

Figure 9:
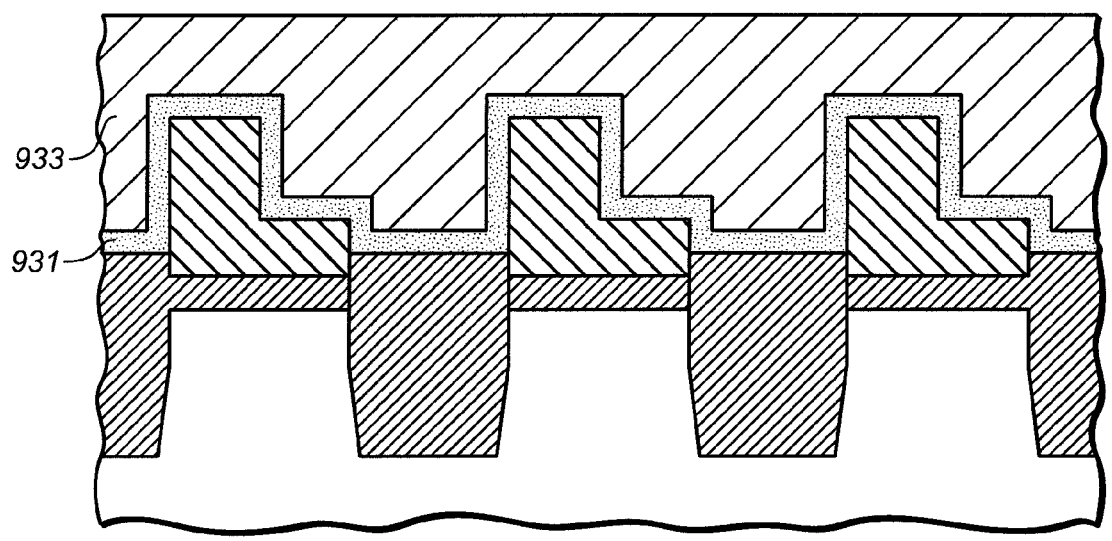
FIG. 9 shows the structure of FIG. 8A after deposition of a dielectric layer and a conductive layer overlying the dielectric layer.

FIG. 9 shows the results of deposition of a dielectric layer 931 (inter poly dielectric) and control gate layer 933 over conductive portions of either FIG. 8A or 8B. Dielectric layer 931 may be a single layer (such as a layer of Silicon Dioxide) or may be a compound layer (such as an Oxide-Nitride-Oxide, or ONO layer). Control gate layer 933 is made of a conductive material, for example doped polysilicon, some metal, or combination of metals. In some cases a combination of doped polysilicon and a metal silicide is used (for example, cobalt silicide, nickel silicide, or tungsten silicide). Alternatively, a control gate layer can be composed of polysilicon followed by tungsten nitride acting as a barrier layer, and then tungsten. After dielectric layer 931 and control gate layer 933 are formed as blanket layers, the resulting structure is patterned to form word lines and to separate conductive portions into separate floating gates. Word lines extend in the x-direction and typically have a width that is close to F and are spaced apart by a distance close to F, with a pitch remaining equal to 2F. Because word lines are formed by the same step that forms separate floating gates, word lines are self-aligned to floating gates. A word line forms a control gate where it overlies a floating gate of a memory cell. Memory cells that share a word line may be considered to form a row of memory cells.

Figure 10:
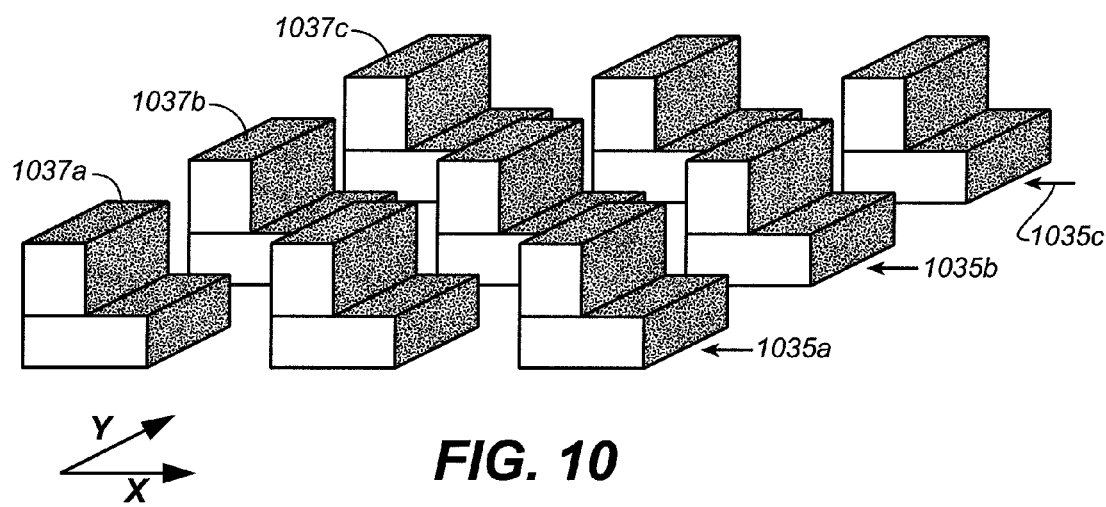
FIG. 10 shows L-shaped floating gates of a memory array according to an embodiment of the present invention.

FIG. 10 illustrates floating gates of three adjacent rows 1035a-c according to the first embodiment. As is shown, L-shaped facets of a floating gate 1037b face similar L-shaped facets of floating gates 1037a, 1037c of the adjacent rows. Dielectric may be deposited between rows 1035a-c. Thus, the opposing facets act as plates of a parallel plate capacitor. However, their areas are reduced compared with a floating gate having a rectangular facet of similar dimensions, so that coupling between neighboring floating gates along the y-direction is reduced.

Counter-Facing L-Shaped Floating Gates

Figure 11:
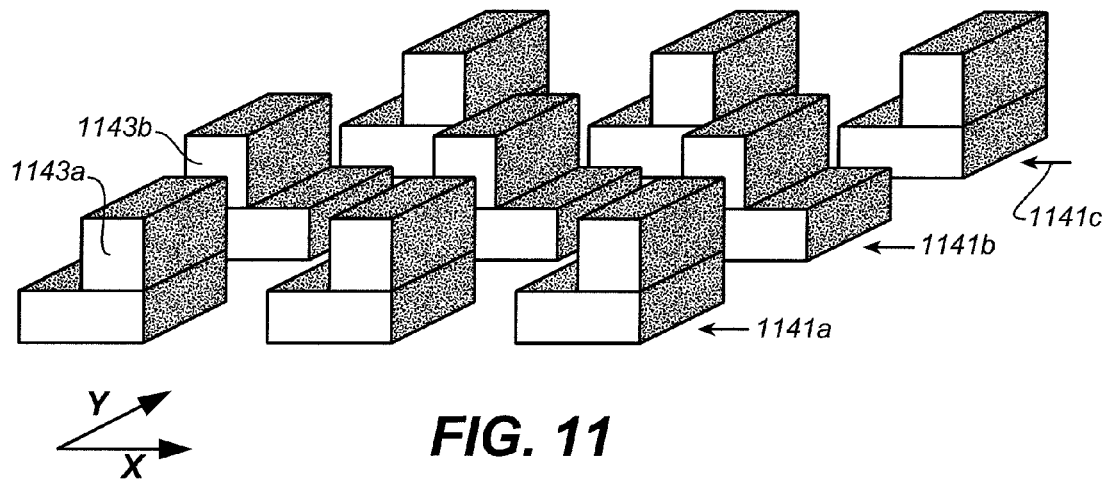
FIG. 11 shows L-shaped floating gates of another embodiment of the present invention, floating gates of a string having alternating orientations, floating gates of a row having the same orientation.

FIG. 11 shows an arrangement of floating gates of three adjacent rows 1141a-c according to another embodiment of the present invention. All floating gates are L-shaped as before. However, floating gates of one row have one orientation and floating gates of an adjacent row have an opposite orientation. Floating gates of row 1141b can be considered to have an L orientation, while floating gates of adjacent rows 1141a, 1141c can be considered to have a reverse-L orientation. This arrangement reduces coupling between the upper portions of floating gates of different rows. Opposing floating gates of adjacent rows have opposite orientations so that upper portions are not directly opposing each other. For example, upper portions 1143a and 1143b do not directly oppose each other. This reduces capacitive coupling between these parts of the floating gates. In this arrangement, the orientation of floating gates alternates from one row to the next with all the floating gates of a particular row having the same orientation. Thus, for example even numbered rows may have floating gates with a first orientation and odd numbered rows may have floating gates with the opposite orientation. Such an arrangement is not limited to floating gates that are L-shaped, but may be applied to floating gates having any asymmetric shape in cross section along the x-direction. For example, floating gates may have a triangular shape in cross section along the x-direction. Floating gates with the arrangement shown in FIG. 11 may be formed in a similar manner to those of FIG. 10 described above, but with some differences in the pattern used for etching conductive portions to form L-shaped cross sectional profiles.

Figure 12A:
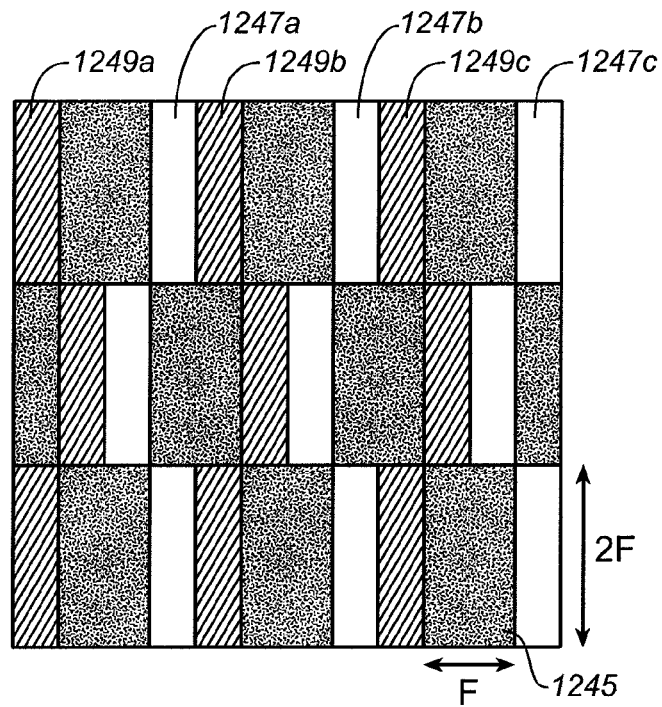
FIG. 12A shows an etch mask that may be used to form the floating gates of FIG. 11 from conductive portions.

FIG. 12A shows a first checkerboard pattern that may be used to etch conductive portions. FIG. 12A also shows how this pattern is aligned to the underlying structure. The pattern may be formed of resist and includes resist portions similar to resist portions 723a-c shown in cross section in FIG. 7A. This checkerboard pattern has rectangular portions that touch at their corners. An individual rectangular portion 1245 has dimensions of F×2F. The checkerboard pattern is offset from the pattern of conductive portions 1247*a-c* and STI structures 1249*a-c* so that individual rectangular portion 1245 of the checkerboard pattern partially overlies a conductive portion 1247*c* and partially overlies an STI structure 1249*c*. This checkerboard pattern protects areas of conductive portions 1247*a-c* and leaves other areas of the conductive portions 1247*a-c* exposed. An etch is performed with the resist pattern in place so that exposed areas of conductive portions 1247*a-c* are partially etched (but not etched through). Protected areas of conductive portions 1247*a-c* are not substantially etched.

Figure 12B:
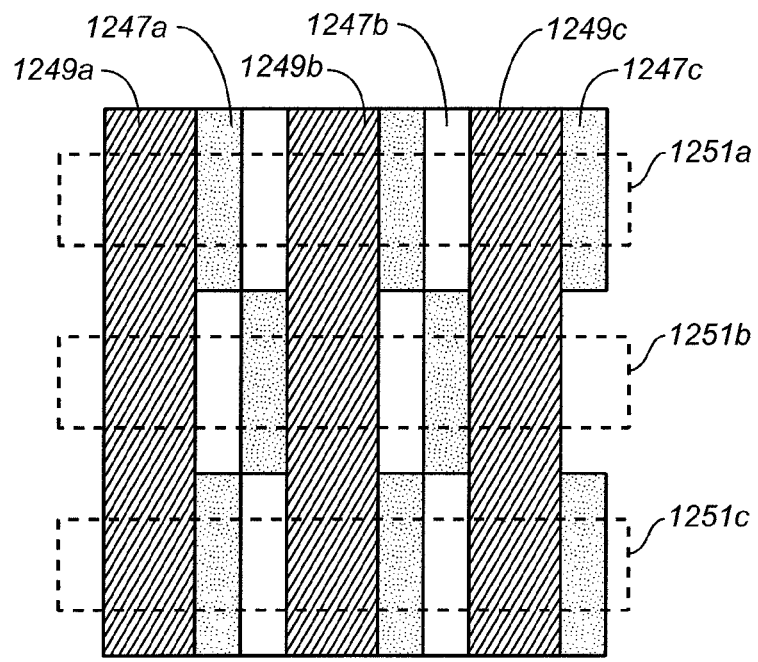
FIG. 12B shows conductive portions patterned by the etch mask of FIG. 12A and the locations of word lines formed over the patterned conductive portions.

FIG. 12B shows a view of conductive portions 1247*a-c* and STI structures 1249*a-c* after patterning according to the pattern of FIG. 12A. Areas that were protected by resist are shaded in this view. Unprotected areas are etched and have a reduced thickness (z-axis dimension) compared with unetched areas of the conductive portions. A dielectric layer and conductive layer (not shown in FIG. 12B) are formed extending over the conductive portions 1247*a-c* and STI structures 1249*a-c*. A stack including conductive portions, dielectric layer and conductive layer are then patterned and etched to form word lines and to form separate floating gates that are self aligned with the word lines over them. FIG. 12B shows the outline of word lines 1251 *a-c*. The areas between word lines 1251*a-c* are etched so that the conductive layer is divided into separate word lines. In the same etch, conductive portions 1247*a-c* are etched through, at least down to the underlying gate dielectric, so that separate floating gates are formed under word lines 1251*a-c*.

Figure 13A:
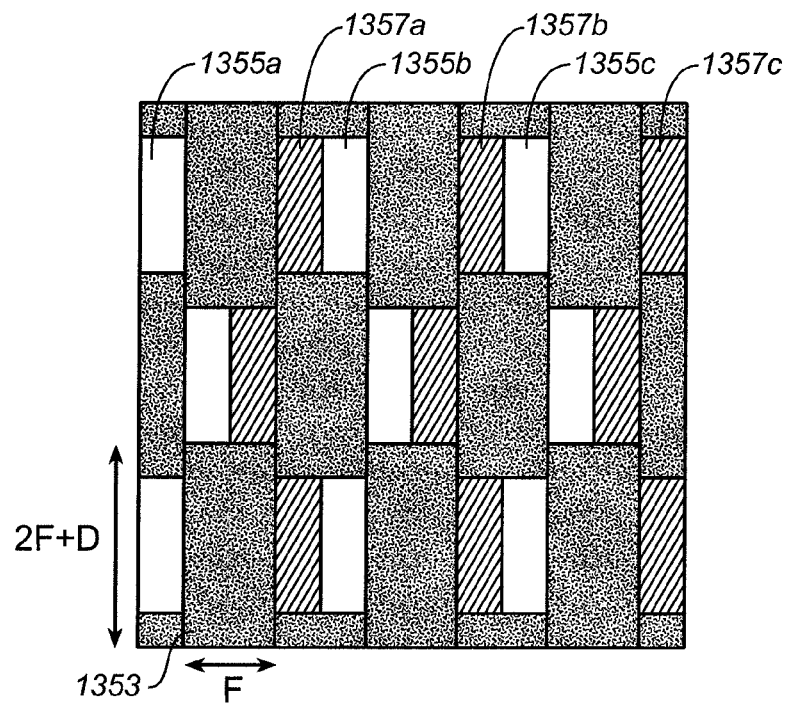
FIG. 13A shows an alternative etch mask that may be used to form the floating gates of FIG. 11 from conductive portions.

FIG. 13A shows an alternative pattern that may also be used to form floating gates with the arrangement shown in FIG. 11. A resist portion 1353 of the pattern of FIG. 13A has a dimension in the x-direction of F and a dimension in the y-direction that is greater than 2F. Here the dimension in the y-direction is 2F+D, where D is small in comparison with F. Spaces between resist portions have a dimension in the y-direction that is 2F−D. Thus, instead of just touching at corners, resist portions contact each other along portions of their sides. This provides continuous areas of conductive portions 1355*a-c* that are covered by resist. After etching of conductive portions 1355*a-c* using a pattern according to either FIG. 12A or 13A, resist portions are removed, STI structures 1357*a-c* are etched back and dielectric and conductive layers are deposited over the substrate as before.

Figure 13B:
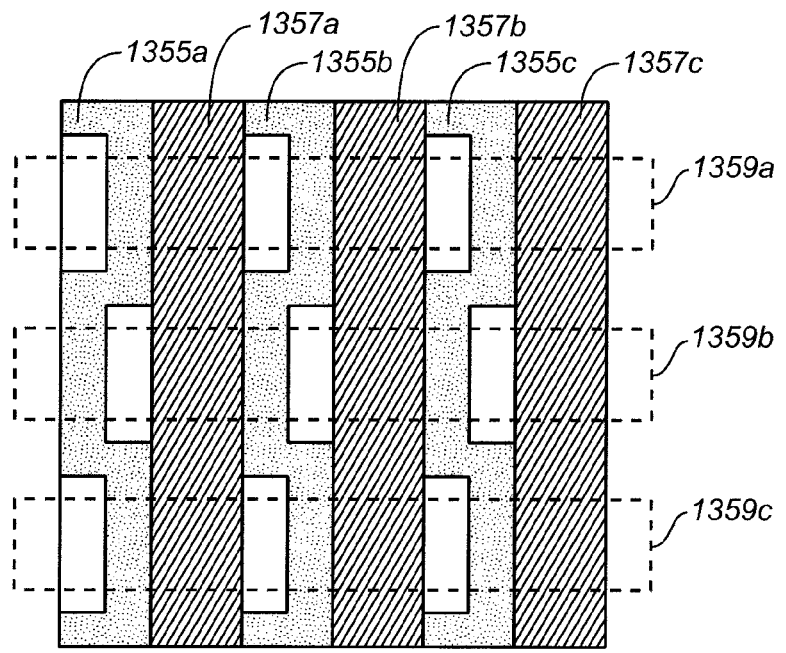
FIG. 13B shows conductive portions patterned by the etch mask of FIG. 13A and the locations of word lines formed over the patterned conductive portions.

FIG. 13B shows a view of conductive portions 1355*a-c* and STI structures 1357*a-c* that are patterned according to the pattern of 13A. The unetched parts of conductive portion 1355*a* of FIG. 13B form a serpentine pattern along conductive portion 1355*a*. The continuous unetched parts form mechanically stronger structures than those that are discontinuous or have little contact (like those of FIG. 12B). Such structures may better withstand potentially damaging forces that occur during processes such as Chemical Mechanical Polishing (CMP). FIG. 13B shows the outlines of word lines 1359*a-c*. While the patterns of FIGS. 12B and 13B have some differences, these differences are located between word lines 1359*a-c*. So, after etching to form separate word lines 1359*a-c* and floating gates, these differing features are removed and the resulting structures are the same for both patterns.

Counter-Facing Floating Gates Along Row

Figure 14:
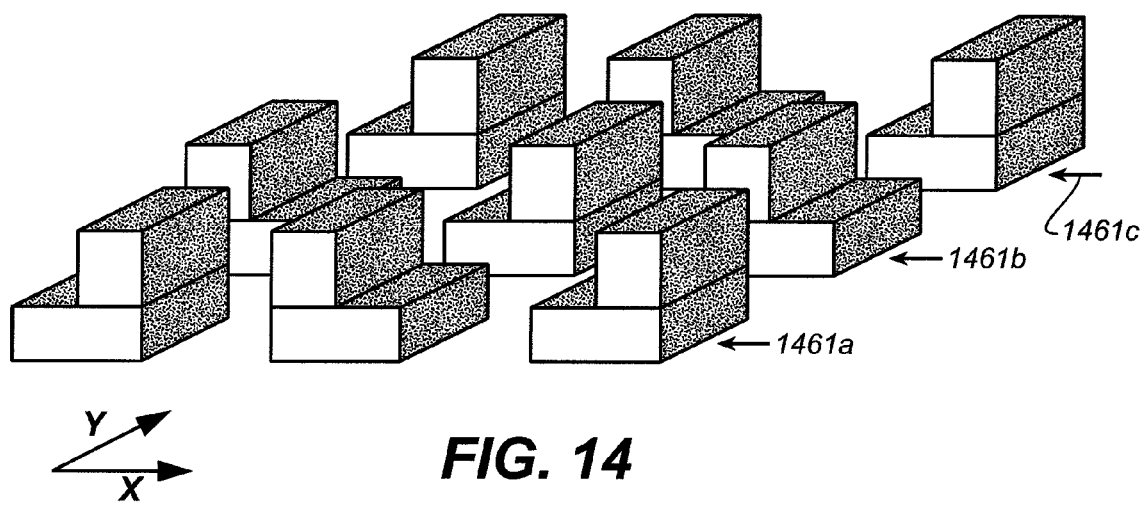
FIG. 14 shows L-shaped floating gates of another embodiment of the present invention, the floating gates having alternating orientations along the bit line direction and the floating gates having alternating orientations along the word line direction also.

FIG. 14 shows another alternative arrangement of floating gates according to another embodiment of the present invention. As before, floating gates are L-shaped in cross section along the x-direction. A floating gate of one row 1461*b* has the opposite orientation to opposing floating gates of adjacent rows 1461*a*, 1461*c*. However, unlike earlier examples, here floating gates alternate in their orientation along a row such as row 1461*b*. Thus, alternate floating gates along a row have a first orientation (L-orientation) while remaining alternate floating gates along the row have a second orientation (reverse-L orientation).

Figure 15A:
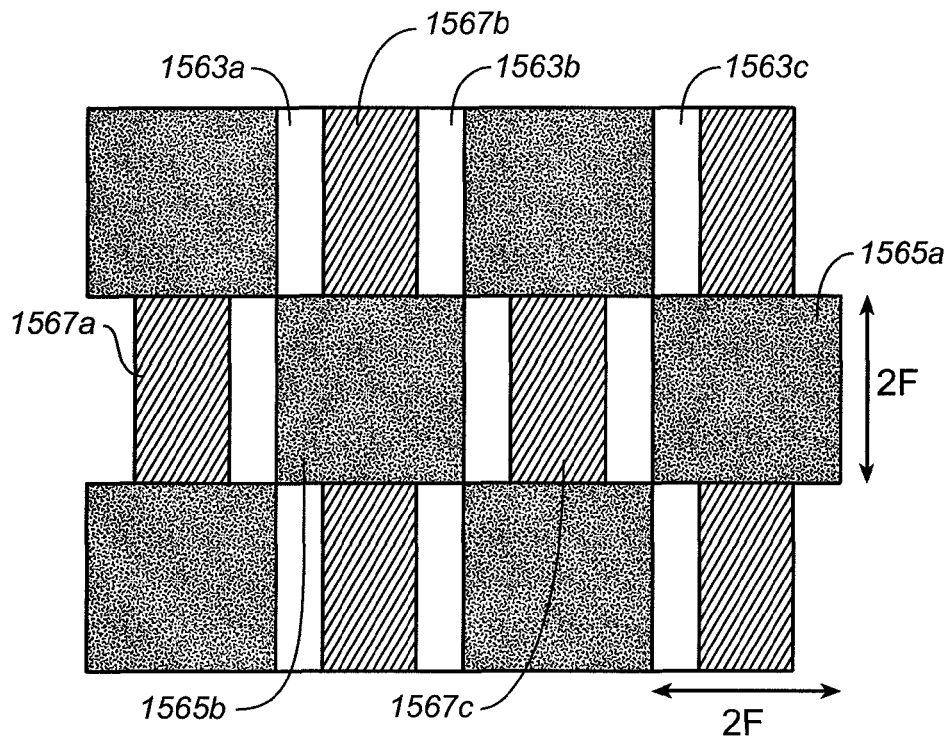
FIG. 15A shows an etch mask that may be used to form the floating gates of FIG. 14 from conductive portions.

FIG. 15A shows a pattern that may be used to form floating gates having the arrangement of FIG. 14. Processing up to the stage shown by FIG. 15A may be carried out as shown in FIGS. 4-6. FIG. 15A shows a checkerboard pattern used as an etch mask for partial etching of conductive portions 1563*a-c*. The pattern includes squares, such as square 1565*a*, that have sides of length 2F. The pattern is aligned with underlying conductive portions 1563*a-c* and STI structures 1567*a-d* so that there is an offset between squares and STI structures 1567*a-d*. Square 1565*b* overlies an STI structure 1567*b* and extends approximately half way over conductive portions 1563*a*, 1563*b* on either side. Thus, square 1565*b* extends approximately F/2 over conductive portions 1563*a*, 1563*b* on either side. An alternative pattern to that of FIG. 15A has resist portion extending more than 2F in the y-direction so that squares make contact along their sides. As discussed earlier, such a pattern may result in structures that are physically stronger than those formed by patterns that have squares only contacting at corners.

Figure 15B:
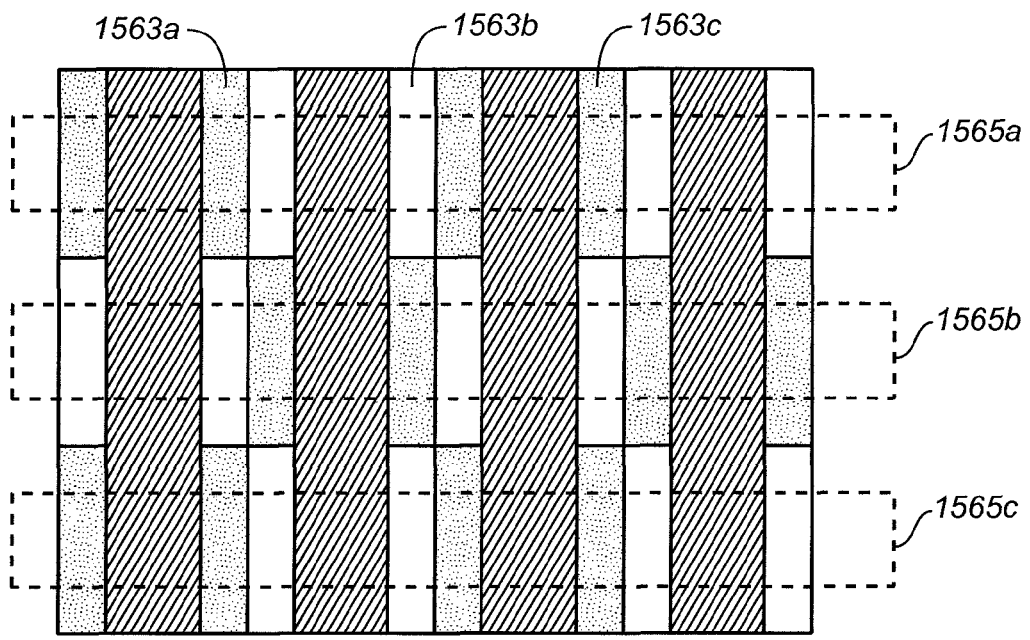
FIG. 15B shows conductive portions patterned by the etch mask of FIG. 15A and the locations of word lines formed over the patterned conductive portions.

FIG. 15B shows the result of etching with the pattern of FIG. 15A in place. Unshaded areas of conductive portions 1563*a-d* are etched to have a vertical thickness that is less than that of the remainder of conductive portions 1563*a-d*. As in the example above, word lines 1565*a-c* are shown in outline. Here, it can be seen that floating gates along a word line alternate in orientation (etched areas are on alternating sides of a conductive portion). As before, a dielectric layer and conductive layer are deposited over the STI structures and conductive portions. Then, a word line mask is aligned so that word lines 1565*a-c* extend as shown, with corners of the pattern occurring between word lines 1565*a-c*. The conductive layer is separated into separate word lines and conductive portions 1563*a-d* are separated into separate floating gate together.

While the example shown in FIG. 14 shows floating gates having alternating orientation along both rows (X-direction) and columns (Y-direction), this is not always the case. In other examples, floating gates may have alternating orientations along a row but not along a column. Thus, all the floating gates in a particular column may have the same orientation, but floating gates of neighboring columns have a different orientation. Such floating gates may be formed using a resist pattern that consists of strips running in the column direction to partially overlie conductive portions on either side of an STI structure.

Although the various aspects of the present invention have been described with respect to exemplary embodiments thereof, it will be understood that the present invention is entitled to protection within the full scope of the appended claims.

The invention claimed is:

1. A NAND flash memory array, comprising:
a plurality of NAND strings of memory cells, an individual NAND string of memory cells comprising a plurality of memory cells connected in series along a first direction, an individual cell of the plurality of memory cells having a floating gate that is L-shaped in cross section along a plane perpendicular to the first direction; and
a plurality of word lines extending in a second direction that is perpendicular to the first direction, each of the word lines connects a row of memory cells of the plurality of NAND strings of memory cells, wherein floating gates along a given one of the rows have the same orientation along the second direction, wherein first alternate ones of the plurality of memory cells on a given NAND string have a first orientation in cross section perpendicular to the first direction and second alternate ones of the plurality of memory cells on the given NAND string have a second orientation in cross section perpendicular to the first direction, the second orientation is opposite the first orientation.

2. The NAND flash memory of claim 1 wherein the first alternate ones of the plurality of memory cells have an L-shape in cross section perpendicular to the first direction and the second alternate ones of the plurality of memory cells have a reverse L-shape in cross section perpendicular to the first direction.

3. The NAND flash memory of claim 1 wherein the floating gate has a dimension in the first direction and the same dimension in the second direction, the dimension being equal to the minimum feature size of a lithographic process used to form the individual cell.

4. The NAND flash memory of claim 1 wherein the floating gate includes a lower portion with a first dimension in the second direction, and an upper portion that has a second dimension in the second direction, the first dimension equal to the minimum feature size of a lithographic process used to form the floating gate, the second dimension being less than the first dimension.

5. The NAND flash memory of claim 4 wherein the second dimension is half the first dimension.

6. The NAND flash memory of claim 4 wherein the second dimension is less than half the first dimension, the second dimension determined by deposition of a conductive layer, the second dimension being independent of pattern alignment.

7. A flash memory array, comprising:
a plurality of memory cells, each of the plurality of memory cells having a floating gate;
a plurality of word lines extending in a first direction, the plurality of word lines overlying the plurality of floating gates, each of the word lines connects a row of memory cells of the plurality of memory cells;
the memory cells are arranged in a plurality of columns extending in a second direction that is perpendicular to the first direction;
first alternate ones of a plurality of floating gates along an individual one of the plurality of columns having a first orientation in cross section along the first direction; and
second alternate ones of the plurality of floating gates along the column having a second orientation in cross section along the first direction, the second orientation being opposite to the first orientation, wherein floating gates of memory cells along a given one of the rows have the same orientation along the first direction.

8. The flash memory of claim 7 wherein the first alternate ones and the second alternate ones of the plurality of memory cells are connected together in series in the second direction to form a NAND string.

9. The flash memory of claim 7 wherein the first alternate ones of the plurality of floating gates have an L-shape in cross section along the first direction and the second alternate ones of the plurality of floating gates have a reverse L-shape in cross section along the first direction.

10. The flash memory of claim 7 wherein the first alternate ones of the plurality of floating gates have an L-shape in cross section along the first direction, the second alternate ones of the plurality of floating gates have a reverse L-shape in cross section along the first direction and floating gates along the row have the same orientation of L-shape in cross section along the first direction.

11. The flash memory of claim 7 wherein the plurality of floating gates overlie a gate dielectric, an individual one of the plurality of floating gates having a surface in contact with the gate dielectric that is square, with a side dimension that is equal to the minimum feature size of a lithographic process used to form the memory array.

12. The flash memory of claim 7 further comprising a plurality of shallow trench isolation structures extending in the second direction, an individual shallow trench isolation structure extending between two adjacent columns.

13. A flash memory array, comprising:
a plurality of memory cells, each of the plurality of memory cells having a floating gate structure, wherein each of the plurality of memory cells has a single floating gate;
a plurality of word lines extending in a first direction, the plurality of word lines overlying the plurality of floating gate structures;
a plurality of bit lines extending in a second direction that is perpendicular to the first direction;
the floating gate structure in first alternate ones of memory cells along an individual one of the plurality of bit lines having a first orientation in cross section along the first direction; and
the floating gate structure in second alternate ones of memory cells along the bit lines having a second orientation in cross section along the first direction, the second orientation being opposite to the first orientation.

* * * * *